US006842712B2

(12) United States Patent
Liau

(10) Patent No.: US 6,842,712 B2
(45) Date of Patent: Jan. 11, 2005

(54) METHOD FOR TESTING AN ELECTRONIC COMPONENT; COMPUTER PROGRAM PRODUCT, COMPUTER READABLE MEDIUM, AND COMPUTER EMBODYING THE METHOD; AND METHOD FOR DOWNLOADING THE PROGRAM EMBODYING THE METHOD

(75) Inventor: Chee Hong Eric Liau, München (DE)

(73) Assignee: Infineon Technologies AG, Munich (DE)

( * ) Notice: Subject to any disclaimer, the term of this patent is extended or adjusted under 35 U.S.C. 154(b) by 47 days.

(21) Appl. No.: 10/431,900

(22) Filed: May 8, 2003

(65) Prior Publication Data

US 2003/0212517 A1 Nov. 13, 2003

(30) Foreign Application Priority Data

May 8, 2002 (EP) ............................................. 02010478

(51) Int. Cl.⁷ ......................... G06F 19/00; G01R 31/00
(52) U.S. Cl. ...................... 702/120; 324/158.1; 702/82; 714/718; 714/736
(58) Field of Search .................. 702/82, 120, 185; 324/158.1, 765, 769; 714/718, 724, 734, 736, 737

(56) References Cited

U.S. PATENT DOCUMENTS

| | | | | |
|---|---|---|---|---|
| 4,606,025 A | * | 8/1986 | Peters et al. ................. | 714/718 |
| 4,646,299 A | * | 2/1987 | Schinabeck et al. ........ | 714/736 |
| 5,592,077 A | * | 1/1997 | Runas et al. ............. | 324/158.1 |
| 5,742,177 A | | 4/1998 | Kalb, Jr. ...................... | 324/765 |
| 5,939,894 A | | 8/1999 | Yamauchi et al. .......... | 324/765 |
| 6,239,609 B1 | | 5/2001 | Sugasawara et al. ........ | 324/769 |

OTHER PUBLICATIONS

Baker, K. et al.: "Shmoo Plotting: The Black Art of IC Testing", IEEE Design &Test of Computers, vol. 14, No. 3, Jul. 1, 1997, pp. 90–97.
Kaushik, R. et al.: "Stress Testing of Combinational VLSI Circuits Using Existing Test Sets", VLSI Technology Systems and Applications, 1995, Proceedings of Technical Papers, 1995, International Symposium on Taipei, Taiwan, May 31—June 2, 1995, New York, IEEE, May 31, 1995, pp. 93–98.
Press, W. H. et al.: "Numerical Recipes in C, The Art of Scientific Computing", Chapter 14: Statistical Description of Data, 14.5 Linear Correlation, 2. Ed., Cambridge University Press, 1995, pp. 636–639.

(List continued on next page.)

*Primary Examiner*—John Barlow
*Assistant Examiner*—John Le
(74) *Attorney, Agent, or Firm*—Laurence A. Greenberg; Werner H. Stemer; Ralph E. Locher

(57) ABSTRACT

A method tests an electronic component, especially a memory chip, which is connected to a computer system. Initially, test patterns and AC-/DC-parameters are read into the computer system. Then, the computer system generates an input test pattern for the electronic component. Afterwards, a simulation process is performed processing the input test pattern by the electronic component and measuring the current flowing in the electronic component. Ultimately, the method produces a statement concerning the functionality of the tested electronic component. Program instructions for causing a computer system to perform the above-described method for testing an electronic component can be stored in a computer program, a computer readable medium, a computer memory, a read-only memory, an electrical carrier signal, and a carrier, especially a data carrier. A computer system runs the computer program embodying the method.

63 Claims, 6 Drawing Sheets

OTHER PUBLICATIONS

Fletcher, R.: "Practical Methods of Optimization", Structure of Methods, 2.6 Algorithms for the Line Search Subproblem, John Wiley & Sons Ltd., 1987, pp. 33–40.

Baker, R. J. et al.: "CMOS Circuit Design, Layout, and Simulation", Part I CMOS Fundamentals, Chapter 6: The BSIM SPICE Model, 6.2 BSIM 1 DC Equations, IEEE Press Series on Microelectronic Systems, 1998, pp. 111–119.

Kreyszig, E.: "Advanced Engineering Mathematics", Chapter 19: Numerical Methods in Linear Algebra, 19.3 Linear Systems: Solution by Iteration, John Wiley & Sons Inc., 1995, pp. 986–988.

Author not listed: "Current Monitor for ICC Tests", J973AP Applications / Course Guide, Training Manual V.2.7.0, ICC Test, Teradyne Copy, 1999, pp. 257–261.

* cited by examiner

FIG. 4

1: Save Default Specification $T_{default} = T(P_{default}, RS_{default})$

2: INPUT: $\{P\ RS_{DC/AC}\ (RV, ARS)_{ARS} = \{1\ 2\ ...\ m\}, \forall ARS \geq 1$
$$RS \in RS_{DC} \oplus RS_{AC}$$

3: For $i = 0, 1, 2, 3, \ldots, m-1$ do:

4: { Check if $RS_{DC/AC}(RV, i)$ combination valid?

5:    else $RS_{DC/AC}\ (RV, i)$ invalid, exit(1).

6:  If $(RS_{DC/AC}(RV, i)$ valid)

7:  {

8:   Set Hardware DC/AC Driver to $RS_{DC/AC}(RV, i)$

9:   Check $P_i \in \{Static\_pattern\ Dynamic\_pattern\}$

10:   Start Pattern Generator: $P_i$

11:   Start Current Measurement & Calculation:

12:   $I_{Measurement}\ (T(P_i, RS(RV, i))) = I_{R_{eff}}\ (T(P_i, RS(RV, i)))$

13:        $+ I_{L_{eff}}(T(P_i, RS(RV, i)))$

14:        $+ \Delta I_{CMOS}\ (T(P_i, RS(RV, i)))$

15:   Stop Pattern Generator: $P_i$

16:  }}

17:  OUTPUT: $I_{Measurement}\ (T(P_0, RS(RV, 0)))$

18:      $I_{Measurement}\ (T(P_1, RS(RV, 1)))$

19:      $I_{Measurement}\ (T(P_2, RS(RV, 2)))$

20:      $I_{Measurement}\ (T(P_3, RS(RV, 3)))$

21:      $I_{Measurement}\ (T(P_4, RS(RV, 4)))$

22:      $I_{Measurement}\ (T(P_5, RS(RV, 5)))$, $\forall I \leq m-1$

23: Restore Default Specification $T_{default} = T\ (P_{default}, RS_{default})$

FIG. 5

| Line No. | Clock | Command | Address | Data Input | Data Output |
|---|---|---|---|---|---|
| 1 | 1 | Activate | Row 5 (out of 512) | - | - |
| 2 | 1 | Write | Column 1 (out of 32) | a | - |
| 3 | 1 | Write | Column 2 (out of 32) | 5 | - |
| 4 | 1 | Write | Column 3 (out of 32) | a | - |
| 5 | 1 | Write | Column 4 (out of 32) | 5 | - |
| 6 | 1 | Read | Column 1 (out of 32) | a | - |
| 7 | 1 | Read | Column 2 (out of 32) | a | - |
| 8 | 1 | Read | Column 3 (out of 32) | a | - |
| 9 | 1 | Read | Column 4 (out of 32) | a | R00 |
| 10 | 1 | Idle | Column 0 (out of 32) | - | RFF |
| 11 | 1 | Idle | Column 0 (out of 32) | - | R00 |
| 12 | 1 | Pre-charge | Row 5 (out of 512) | - | RFF |

↑
23

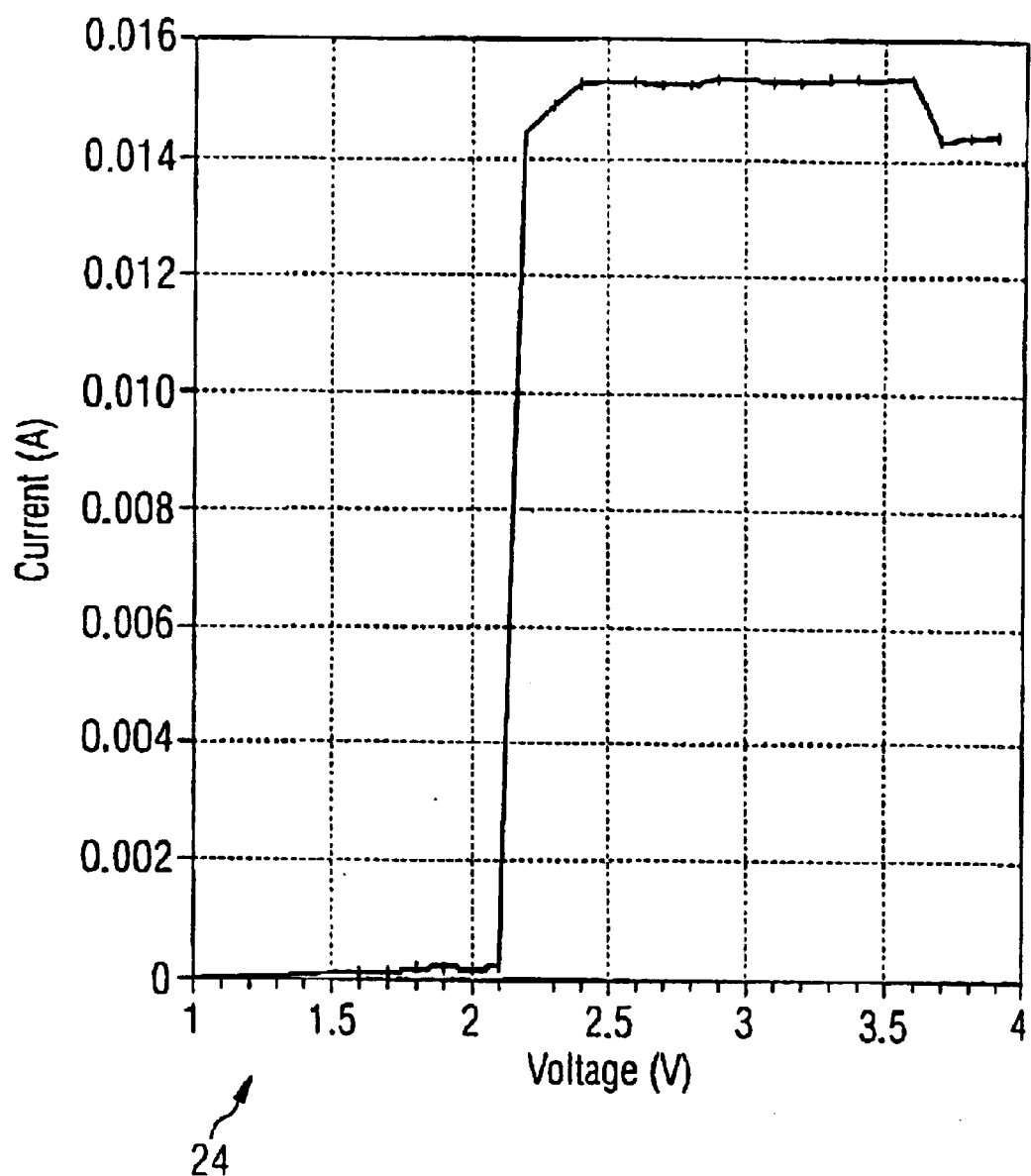

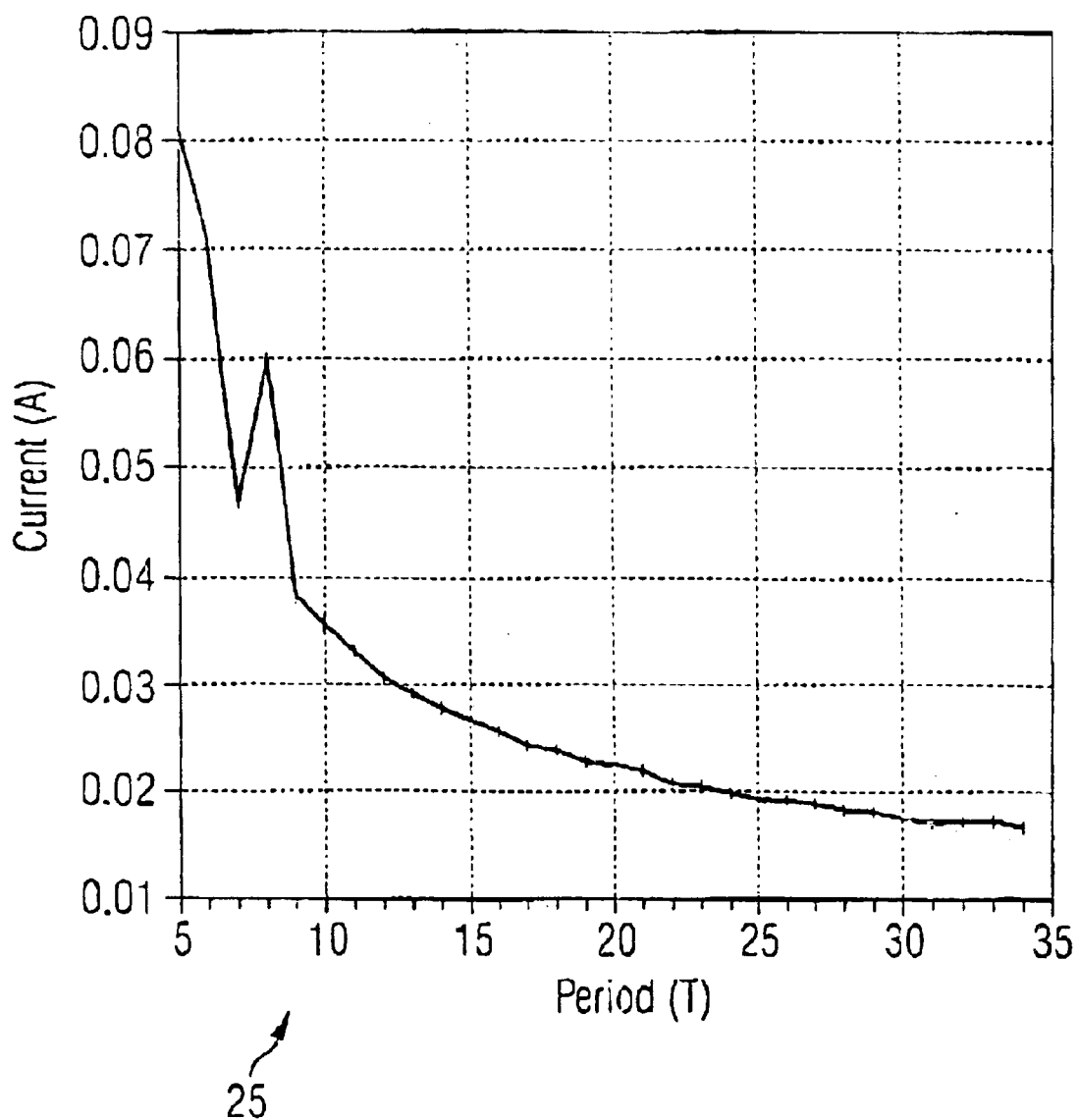

METHOD FOR TESTING AN ELECTRONIC COMPONENT; COMPUTER PROGRAM PRODUCT, COMPUTER READABLE MEDIUM, AND COMPUTER EMBODYING THE METHOD; AND METHOD FOR DOWNLOADING THE PROGRAM EMBODYING THE METHOD

BACKGROUND OF THE INVENTION

Field of the Invention

The present invention relates to a method for testing an electronic component; a computer program, a computer readable medium, a computer memory, a read-only memory, an electrical carrier signal, a data carrier, and a computer embodying the method; and a method for downloading the program embodying the method.

Large voltage drops can affect the reliability and the performance of electrical components. High instantaneous current flowing through the power supply line of the electrical components can cause such voltage drops.

Moreover, electro-migration can lead to short or open circuits. Modern semiconductor devices include a dense array of narrow thin-film metallic conductors transporting currents between the various devices on the chip. These metallic conductors are called interconnects. However, due to continuing miniaturization of very large scale integrated circuits, thin-film metallic conductors or interconnects are subject to increasingly high current densities. Under these conditions, electro-migration can lead to electrical failures of interconnects in relatively short times, reducing the circuit lifetime to an unacceptable level. Electro-migration is generally considered to be the result of momentum transfer from the electrons, which move in the applied electric field, to the ions which make up the lattice of the interconnect material.

Therefore, current analysis is important to estimate the circuit reliability and performance. A common technique to treat this type of current analysis used a current test pattern, fixed DC level, e.g. 2.5 V and AC timing, e.g. 40 MHz.

Following this technique, the test engineer sets up a certain number of AC- and DC-specifications. Then, he creates an individual template for every single specification on the computer system being used for testing, each template containing the concerning specification parameters. Consequently, the templates are compiled on the computer system and the test program is loaded into the computer system. After that, the test program is executed, the measurements being taken subsequently for every template. The required analysis results are obtained. For any new AC- and DC-parameters to be tested a new specification has to be set up and the previously explained steps have to be repeated.

In the common technique, only a variation of a limited and small set of test conditions can be pre-selected and allowed. Furthermore, this method requires design or test engineers to create every individual fixed AC- and DC-specifications for different test conditions. However, analysis steps with high resolution will become almost impossible, as there is a very large combination of different test conditions, particularly AC- and DC-parameters, and as it takes lots of efforts to develop every single analysis resolution step by creating the AC- and DC-specifications manually. Finally, the test program will become extremely large and complicated, it takes a long time to load a test program into the computer system and the test program will run extremely slowly to take every single measurement.

SUMMARY OF THE INVENTION

It is accordingly an object of the invention to provide a method for testing an electronic component; a computer program product, a computer readable medium, and a computer embodying the method; and a method for downloading the program embodying the method that overcome the hereinafore-mentioned disadvantages of the heretofore-known devices of this general type and that estimate the circuit reliability and performance.

With the foregoing and other objects in view, there is provided, in accordance with the invention, a method for testing an electronic component connected to a computer system. The method includes the following steps. The first step is a) reading into the computer system a test pattern for testing a logical functionality of the electronic component. The next step is b) reading into the computer system a number of parameters. The next step is c) checking with the computer system if the parameters read in step b) are valid and available. The next step is d) selecting a first of the parameters. The next step is e) generating with the computer system an input test pattern for the electronic component, the input test pattern including the test pattern read in step a) and a power supply voltage with a DC-level according to a DC-parameter and with a frequency according to an AC-parameter. The next step is f) checking with the computer system if the input test pattern generated in step e) is valid and available. The next step is g) applying the input test pattern generated in step e) to the electronic component in a simulation process by using the computer system. The next step is h) performing the simulation process processing the input test pattern with the electronic component, measuring a current flowing in the electronic component, and recording output data from the electronic component with the computer system. The next step is i) calculating with the computer system an expected value of the current flowing in the electronic component and expected output data of the electronic component. The next step is j) storing, in the computer system, data including the input test pattern, the recorded and the expected output data of the electronic component, and the measured and the expected values of the current. The next step is k) selecting a next one of the parameters. The next step is l) repeating the steps e) to k) until all of the parameters have been processed. The last step is m) analyzing the data stored in step j) and making a statement concerning a functionality of the tested electronic component by considering a deviation between the measured and the expected values of the current and by considering a deviation between the recorded and the expected output data of the electronic component.

With the objects of the invention in view, there is also provided a further method for testing an electronic component connected to a computer system. The method is similar to the previous method but steps a), c), and f) through j) have been replaced with the following steps. Step b') involves reading into the computer system a number of DC-parameters and a fixed frequency. Step d') involves selecting a first DC-parameter from the number of DC-parameters. Step e') involves generating with the computer system an input test pattern for the electronic component, the input test pattern including the test pattern read in step and a power supply voltage with a DC-level according to the DC-parameter selected in at least one of step d') and a next DC-parameter to be selected in step k') and with the frequency read in step b'). Step k') involves selecting the next DC-parameter from the number of DC-parameters. Step l') involves repeating steps e'), f), g), h), i), j), and k') until all of the number of DC-parameters are processed.

With the objects of the invention in view, there is also provided a further method for testing an electronic component connected to a computer system. This method is similar to the initial, above-described method, but steps a) and c) have been replaced with the following steps. Step b*) involves reading into the computer system a number of AC-parameters and a fixed DC-level. Step d*) involves selecting a first of the number of AC-parameters. Step e*) involves generating an input test pattern for the electronic component with the computer system, the input test pattern including the test pattern read in step a) and a power supply voltage with the frequency according to at least one of the AC-parameter selected in step d*) and a next of the AC-parameters to be selected in step k*) and with the fixed DC-level read in step b*). Step k*) involves selecting the next of the number of AC-parameters. Step l*) repeating the steps e*), f), g), h), i), j), and k*), until all of the number of AC-parameters are processed.

The method for testing an electronic component especially relates to a memory chip being connected to a computer system. It includes the following steps:

reading into the computer system static and/or dynamic test patterns for testing the logical functionality of the electronic component, reading into the computer system a number of AC- and/or DC-parameters, checking by the computer system if the AC- and/or DC-parameters are valid and available, selecting a first AC- or DC-parameter, generating an input test pattern for the electronic component with the computer system, the input test pattern includes the read test pattern and a power supply voltage with a DC-level according to a DC-parameter and with a frequency according to an AC-parameter, checking by the computer system if the generated input test pattern is valid and available, applying the generated input test pattern to the electronic component by the computer system in a simulation process, performing a simulation process processing the input test pattern by the electronic component, measuring the current flowing in the electronic component, and recording output data from the electronic component by the computer system, calculating, by the computer system, the expected value of current flowing in the electronic component and the expected output data of the electronic component, storing in the computer system the input test pattern, the recorded and the expected output data of the electronic component, and the measured and the expected values of current.

The above steps beginning with the step of generating an input test pattern for the electronic component with the computer system have to be repeated for further AC- or DC-parameters to be selected, until all AC- or DC-parameters are processed.

Finally, the computer system analyses the stored data and makes a statement concerning the functionality of the tested electronic component by considering the deviation between the measured and the expected values of current.

A basic idea of the invention is that an electronic component can be tested comprehensively and automatically using almost any combination of AC- and/or DC-parameters. A fast and efficient execution of the tests and of the measurements necessary to test an electronic component is provided.

A multitude of different AC- and/or DC-parameters can be integrated in one test without having to set up new specifications of AC- and/or DC-parameters and without having to create new templates containing such specifications in between. Moreover, the inventory method provides a full capability to create a single template for a multitude of different AC- and/or DC-specifications. The inventory method also provides a full flexibility to input any AC- and/or DC-parameters on the fly without setting up new specifications. The inventory method includes an optimized and easy-to-understand sequence of operations and can therefore be executed fast and efficiently.

In a first preferred embodiment, the method according to the invention includes the following steps, which are performed instead of the according aforementioned steps:

reading into the computer system a number of DC-parameters and a fixed frequency or a fixed period, selecting a first DC-parameter, generating an input test pattern for the electronic component with the computer system, the input test pattern including the read test pattern and a power supply voltage with a DC-level according to the selected DC-parameter and with the read frequency, and selecting a next DC-parameter.

The steps beginning with the step of generating an input test pattern for the electronic component with the computer system are repeated for further DC-parameters to be selected, until all DC-parameters are processed.

This embodiment provides an advantageous method for studying the dynamic current behavior of the electronic component, when the supply voltage level of the electronic component is varied whilst its frequency is fixed.

If the step of reading a number of AC- and/or DC-parameters into the computer system includes the reading of a first DC-parameter, of a last DC-parameter, and of a resolution step for the DC-parameters as well as of a fixed frequency or of a fixed period into computer system, the specifications for the tests can be put in into the computer system in a very easy and user-friendly way. This embodiment provides a full flexibility to select analysis resolution steps on the fly. The tests and the measurements can be efficiently performed with multiple steps of very high resolution.

In a further preferred embodiment, the method according to the invention includes the following steps, which get performed instead of the according aforementioned steps:

reading a number of AC-parameters and a fixed DC-level into the computer system, selecting a first AC-parameter, generating an input test pattern for the electronic component with the computer system, the input test pattern includes the read test pattern and a power supply voltage with the frequency according to the selected AC-parameter and with the read fixed DC-level, Then, a next AC-parameter is to be selected. The inventory steps beginning with the step of generating an input test pattern for the electronic component with the computer system are repeated subsequently for each AC-parameter, until all AC-parameters processed.

This embodiment provides an advantageous method for studying the dynamic current behavior of the electronic component, when the frequency of the supply voltage of the electronic component is varied while its supply voltage level is fixed.

If the step of reading a number of AC- and/or DC-parameters into the computer system includes the reading of a first AC-parameter, of a last AC-parameter, and of a resolution step for the AC-parameters as well as of a fixed DC-level, the specifications for the tests can be put in into the computer system in a very easy and user-friendly way. This embodiment provides a full flexibility to select analysis resolution steps on the fly. The tests and the measurements can be efficiently performed with multiple steps of very high resolution.

In a further preferred embodiment, the expected value of current flowing in the electronic component is calculated by a computer system by using the formula:

$$I_{Measurement}(T(P,RS(RV,ARS))) = I_{R_{eff}}(T(P,RS(RV,ARS))) + I_{L_{eff}+\Delta}I_{CMOS}(T(P,RS(RV,ARS))), \forall T \geq 0$$

The inventory method for testing an electronic component including a circuit using a computer system is based on an analysis objective concept of current measurement. A function of input pattern is applied to an electronic component, the input pattern including a combination of reference parameters with respect to different time constants. Having set up this function, comprehensive current measurements can be performed, while various input patterns and different AC-/DC-parameter conditions can be changed on the fly. It eliminates both setting up heaps of specifications and compiling them before use. In particular, the algorithm according to the present invention has the capability of updating all combinations of different specifications and the hardware settings automatically and calculating the analysis results numerically.

The current measurement problem can be formulated as follows:

$$I_{Measurement}(T) = \frac{V_{DD}(T)}{R_{eff}} + \frac{1}{L_{eff}} \int_{T_0}^{T} V_{DD}(T) dT + \Delta I_{CMOS}(T), \forall T \geq 0 \quad (1)$$

In this equation, $V_{DD}(T)$ represents the power supply line of a pin of the electronic component, T is the measurement time constant, and $T_0$ is the starting time of the regarded interval. $R_{eff}$ is the lumped effective resistance and $L_{eff}$ is the lumped effective inductance on the power supply line. $\Delta I_{CMOS}(T)$ is the current calculated by using the Complementary Metal Oxide Semiconductor current estimation model (2). This Complementary Metal Oxide Semiconductor current estimation model (2) is known to a man skilled in the art. Equation (1) shows, that the current measurement is based on the time constant T to control each measurement.

$$\Delta I_{CMOS}(T) = I_{SW}(T) + I_{SC}(T) + I_{leakage}(T) \quad (2)$$

Where $I_{SW}(T)$ is the switching current of the circuit node capacitance, $I_{SC}(T)$ is the transient short-circuit current and $I_{leakage}(T)$ is the standby leakage current.

Assume the reference specification combination for all AC- and DC-parameters as follows:

$$RS_{DC} = \{V_{DD}V_{IH}V_{IL}I_{OH}I_{OL} \ldots \text{etc.}\} \quad (3)$$

$RS_{AC}$ is the set of AC specifications whereas $RS_{DC}$ is the set of DC specifications. Voltage Input High $V_{IH}$ is the upper limit of the interval of the permissible input voltage and Voltage Input Low $V_{IL}$ is the lower limit of the interval of the permissible input voltage. Current Output High $I_{OH}$ is the upper limit of the interval of the permissible output current whereas Current Output Low $I_{OL}$ is the lower limit of the interval of the permissible output current.

$$RS_{AC} = \{period\_ws \ period\_pg \ hold\_ws \ hold\_pg \ldots \text{etc.}\} \quad (4)$$

period_ws is the testing device frequency. The waveform generator is able to generate a programmable waveform with a "return to low" format. That means, whenever a pattern generator is not generating patterns, the waveform generator will return to low and to 0 in logic explanation respectively.

For example, the variable of the clock period having a 50% duty cycle of the total period for the pattern generator can be programmed by: period_ws/2. Therefore, the waveform generator is generating a constant current level, as long as the pattern generator is generating patterns. If the pattern generator stops after period_ws/2, the waveform generator will return to low and to 0 in logic explanation respectively.

period_pg is the specified period of the device. This variable defines the specified instruction timing measurement. It may be desirable to measure the dynamic current when having a critical timing for read instructions while other timing parameters keeping their normal specification values. Therefore, period_pg is used to setup a second variable in the test pattern period_pg being flexible to setup for different AC or DC parameters for different test patterns.

For example, the read instruction having a timing of 100 MHz can be provided with the variable period_pg, whereas the instructions: Write and Idle having a timing of 50 MHz can be provided with the variable period_ws.

hold_ws is the variable for hold time. The waveform generator is able to generate a "non-return format" for typical signal driving. That means, that the waveform will not change and will remain at the previous high or low value even if the pattern generator is not generating patterns any more. The signal remains until the next driving signal changes. For each "non-return format" drive signal, the hold time or the setup time can be defined.

hold_pg is the hold time variable for the specified variable period_pg, the concept being similar to the one being explained above.

From (3) and (4), the combination of reference specifications will be $RS \in RS_{DC} \oplus RS_{AC}$. Assuming the set of possible current pattern is $P = (p_1, p_2, \ldots, p_N)$, with N being the maximum number of current pattern.

So the time constant T formulates as a function of the set of current patterns P and of the reference specification RS as follows:

$$\forall T = \sum_{ARS \in \{1,2,\ldots,m\}} T(P, RS(RV, ARS)) \geq 0 \quad (5)$$

RV stands for the input reference values based on the reference specification RS. ARS is the analysis resolution step. m is the total number of reference values RV.

From equation (1) and equation (5), the following equations are derived:

$$I_{R_{eff}}(T(P, RS(RV, ARS))) = \frac{V_{DD}(T)}{R_{eff}} = \frac{V_{DD}(T(P, RS(RV, ARS)))}{R_{eff}} \quad (6)$$

$$I_{L_{eff}}(T(P, RS(RV, ARS))) = \quad (7)$$
$$\frac{1}{L_{eff}} \int_{T_0}^{T} V_{DD}(T) dT = \frac{1}{L_{eff}} \int_{T_0}^{T} V_{DD}(T(P, RS(RV, ARS))) dT$$

$$\Delta I_{CMOS}(T(P,RS(RV,ARS))) = I_{SW}(T(P,RS(RV,ARS))) + I_{SC}(T(P,RS(RV,ARS))) + I_{Leakage}(T(P,RS(RV,ARS))) \quad (8)$$

From equations (6), (7), (8) the following equation (9) is obtained:

$$I_{Measurement}(T(P,RS(RV,ARS)))=I_{R_{eff}}(T(P,RS(RV,ARS)))+I_{L_{eff}}(T(P,RS(RV,ARS)))+\Delta I_{CMOS}(T(P,RS(RV,ARS))), \forall T \geq 0 \quad (9)$$

Equation (9) is the objective function to measure current with respect to each combination of reference specifications and with respect to patterns at each time constant. According to the invention, a dynamic loop algorithm is then formulated based on equation (9) to create a dynamic numerical loop to measure and to compute the current result without any complicated set-up requirements.

Generally, electronic components having the following features can be tested by the method according to the invention. The electronic components include at least one input line for transmitting input data from the computer system to the electronic component, at least one output line for transmitting output data from the electronic component to the computer system, and at least one power supply line. Electronic components having four input lines, particularly a clock line, a command line, an address line, and a data input line are particularly suitable to be tested with the method according to the invention.

The current flowing in the electronic component can be measured advantageously using the resistance of the power supply line of the electronic component.

If the computer system has a separate pattern generator for generating input test patterns, very good test results are obtained. Such a pattern generator includes a DC-level controller, an AC-waveform generator, and a vector memory. The function of a DC-level controller, of an AC-waveform generator and of a vector memory are known to a man skilled in the art. Test patterns generated by the pattern generator can directly be applied to the electronic component via the data input lines, via the data output lines and via the power supply line.

The invention is also verified by a computer program for carrying out a method for testing an electronic component, the computer program including program instructions for causing the computer system to perform the method. The computer program is configured in a way, that at first static and/or dynamic test patterns for testing the logical functionality of the electronic component and a number of AC- and/or DC-parameters are read into the computer system. The test program only needs to be started once at the beginning of the tests without any need of reloading the test program again. The tests are performed automatically and subsequently for the different AC- and/or DC-parameters by the computer program.

Any AC- and/or DC-parameters can be put in on the fly without any recompilation and without reloading the test program. So there is no need to recompile or even to compile any new set-up of specifications. The test program provides a powerful on-line creation and execution capability.

The test patterns, the measured and the calculated values get stored automatically. This data is then analyzed automatically and test results are generated automatically by the computer program. Based on these test results, a statement about the functionality of the tested electronic component can be made.

By using such a computer program an improved testing of electronic components, a simple and at the same time very effective analysis of test chip errors and an advantageous execution time are ensured. The inventory method can be set up in any computer-based test program easily and fast.

The invention also relates to a computer program embodied on a record medium, to a computer program stored in a computer memory or embodied in a read-only memory, and to a computer program carried on an electrical carrier signal. Furthermore, the invention relates to a carrier, especially a data carrier, having thereon a computer program as well to a computer system having a computer program stored therein. Finally, the invention relates to a method including the step of downloading the above-described computer program from an electronic data network, especially from the Internet, to a computer system, which is connected to the electronic data network.

Other features that are considered as characteristic for the invention are set forth in the appended claims.

Although the invention is illustrated and described herein as embodied in a method for testing an electronic component; a computer program product, a computer readable medium, and a method for downloading the program embodying the method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a pseudo-code-listing of the test program for the test chip according to FIG. 1 executable on the computer system according to FIG. 1;

FIG. 5 is a pattern table including a test pattern for the test chip according to FIG. 1;

FIG. 6 is a graph plotting current versus voltage during a first run of the test program according to a first embodiment; and FIG. 7 is a graph plotting current versus time during a second run of the test program according to a second embodiment.

DESCRIPTION OF THE PREFERRED EMBODIMENTS

Figure 1:
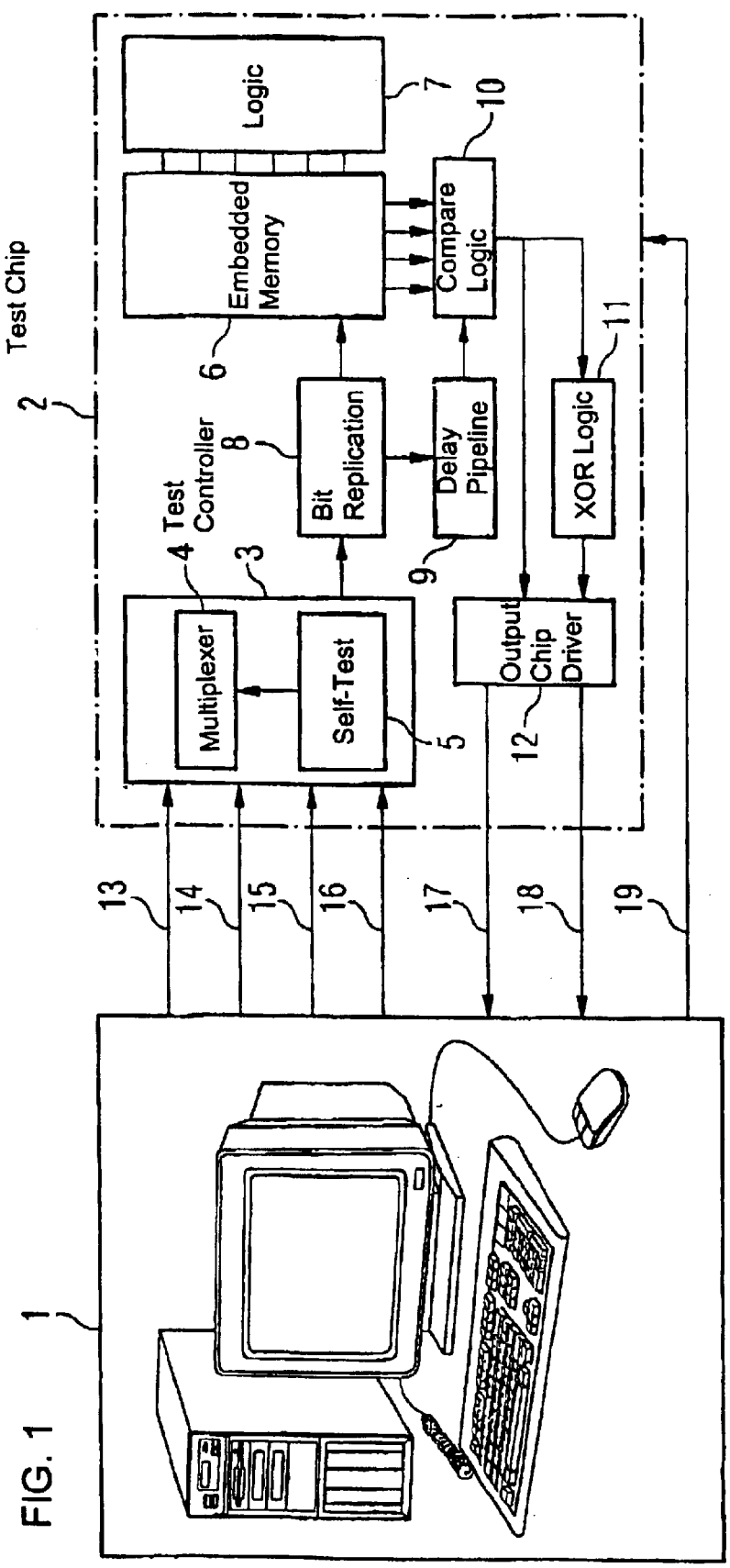
FIG. 1 is a partial diagrammatic and partial schematic drawing showing a computer system and of a test chip connected to the computer system.

Referring now to the figures of the drawings in detail and first, particularly to FIG. 1 thereof, there is shown a schematic drawing of a computer system 1 and of a test chip 2 connected to the computer system 1.

The computer system 1 is a standard computer system 1 for testing electrical components, especially memory chips. The computer system 1 in the embodiment uses a J973 tester, which is known to one with ordinary skill in the art. For the testing purpose, the computer system 1 includes a program for testing the test chip 2, which is explained later. FIG. 1 shows the test chip 2 subdivided into different sections according to its logical functions. In the embodiment, the test chip 2 is a DRAM test chip, especially a C10DD0 eDRAM Jupiter Test Chip. The test chip 2 is connected to the computer system 1 via a clock line 13, via a command line 14, via an address line 15, via a data-in line 16, via a data-out line 17, via a failbit line 18, and via a power supply line 19.

According to the embodiment, the clock line 13 is a one (1) bit [1:0] line for transmitting clock signals to the test chip 2. The command line 14 is a five (5) bit [0:4] line for transmitting command signals and instruction signals respectively to the test chip 2, such as "Activate", "Idle", "Write", "Read", or "Pre-charge". The address line 15 is a nine (9) bit [0:8] line for addressing the memory cells of the test chip 2. The data-in line 16 is a four (4) bit [0:3] line for transmitting binary input values to the test chip 2.

The data-out line 17 is an eight (8) bit [0:7] line for transmitting binary output values from the test chip 2 to the computer system 1. The failbit line 18 is a one (1) bit [0:1] line for transmitting Pass- /Fail-Information of the test chip 2, i.e. the logical values "1" or "0", to the computer system 1. The power supply line 19 provides the test chip 2 with voltage and current respectively, especially alternating current. Therefore, the power supply line 19 provides the test chip 2 with a fixed level of current and additionally with a programmed waveform of the current, especially with a certain frequency.

Inside the test chip 2, there is a test controller 3 containing a multiplexer 4 and a self-test 5. The multiplexer 4 combines the signals of the clock line 13, the command line 14, the address line 15, and the data-in line 16 and transmits the combined signals to a bit replication 8 of the test chip 2. The self-test 5 is a state machine based Build in Self Test providing an individual test stimulus accessible using simple multiplexer 4 switching. The self-test 5 is to be seen differently from the tests executed by the computer system 1. However, test results from the self-test 5 can be utilized from the computer system 1 for the actual tests according to the invention.

In the test chip 2, an embedded memory 6 is provided and includes a one (1) MBit block memory with five hundred and twelve (512) total row bits, with thirty two (32) total column bits and with a sixty-four (64) bit interface. So, the memory capacity of the embedded memory 6 calculates as follows:

1 MBit block memory=512×32×64 bits=1,048,576 Bits

The test controller 3 provides direct access to the embedded memory 6 via the computer system 1. Therefore, the bit replication 8 replicates the data transmitted to the test chip 2 via the data-in line 16. The test pattern and test stimuli respectively are the input signals for the test chip 2.

A four-bit (4-bit) data stimulus will be replicated sixty-four (64) bits wide and will be written into the embedded memory 6 in order to generate a complete word. For example, the value "5", which is "0101" in binary coding, will be replicated to "0101 0101 . . . 0101" (64 times "0101") in the embedded memory 6. Via a combined logic 7 section, the embedded memory 6 can be connected directly to other electronic components not shown in FIG. 1.

The replicated data is transmitted from the bit replication 8 both to the embedded memory 6 and to a compare logic 10 via a delay pipeline 9. In the embedded memory 6, the replicated data gets processed, i.e. read or written. The compare logic 10 receives data both from the delay pipeline 9 and from the embedded memory 6. In the compare logic 10, the actual signals from the embedded memory 6 get compared to the signals, which are generated by the test controller 3 and transmitted to the compare logic 10 via the delay pipeline 9. The compare logic 10 is used during "READ"-operations, especially triggered by the command "READ" of the command line 14 after final sensing to compare the sixty-four (64) bit wide data input after waiting in the signal delay pipeline 9, which can include a latency controller not shown in FIG. 1.

When using the self-test 5, an XOR logic 11 is additionally provided for transforming the output bits of the compare logic 10 into a single bit, indicating "Pass", i.e. logical "0" or "Fail", i.e. logical "1".

The output signals of the compare logic 10 and of the XOR logic 11 are transmitted to an output chip driver 12. From this output chip driver 12, the eight (8) bit output data is transmitted to the computer system 1 via the data-out line 17 and the Pass-/Fail-Information of the test chip 2 is transmitted to the computer system 1 via the failbit line 18.

In the embodiment the embedded memory 6 is provided with a voltage of 1.8V, the test controller 3 and the compare logic 10 are provided with a voltage of 2.5 V and the output chip driver is provided with a voltage of 3.3 V.

The purpose of testing the test chip 2 is to verify the circuit functionality with respect to various test conditions, including temperature, frequency, power supply level, etc. In summary, the computer system 1 using a test program generates input signals and sends these input signals to the test chip 2 via the clock line 13, via the command line 14, via the address line 15, via the data-in line 16, and via the power supply line 19. In the test chip 2, the input signals get processed and output signals are generated and re-transmitted to the computer system 1. Finally, the actual output signals are compared to the expected output signals. If the actual output signals differ from the expected output signals, the test chip 2 fails the test procedure.

Figure 2:
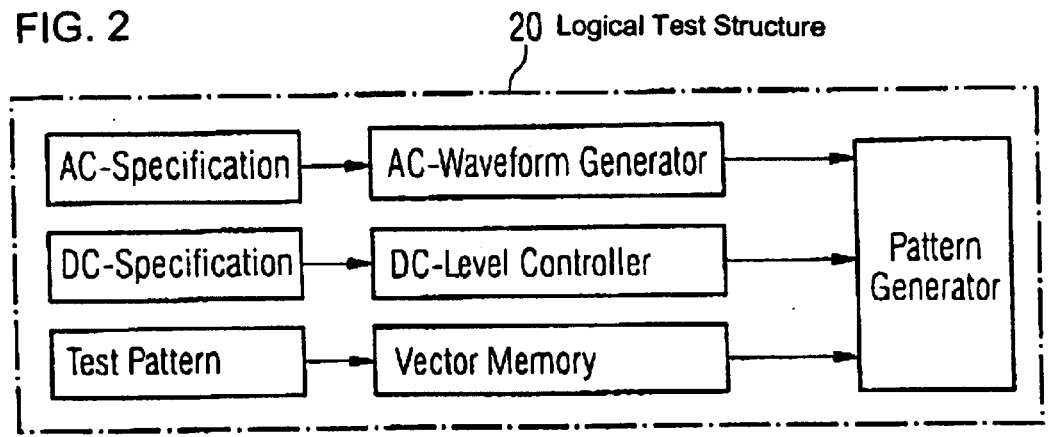
FIG. 2 is a schematic representation showing the logical test structure of a test program for the test chip according to FIG. 1 executable on the computer system according to FIG. 1.

FIG. 2 shows a schematic representation of the logical test structure 20 of the test program for the test chip 2 executable on the computer system 1.

Every electronic component has its operating limitations, especially maximum frequency, maximum power supply, and permissible working temperature range. These limitations are the electronic component's specifications normally including AC and DC parameters.

AC-specifications are focused on timing, such as clock frequency, signal set-up time, and hold time. A typical AC-specification includes a signal set-up time of one nanosecond (1 ns) for all synchronous input signals and a hold time for the valid data of two nanoseconds (2 ns). The timing is controlled by a clock signal. A further typical AC-specification includes a period T=2 ns and/or a frequency f=1/T=500 MHz of the power supply line as well as an order of commands applied to the electronic component and minimum timing limitations for the various command signals of the command signal bus. Such a specified order can contain the commands "Activate", "Idle", "Write", "Pre-charge" and "Idle". The command signal bus can include minimum time values of certain commands, e.g. $T_1$=4 ns for the execution of the commands "Activate" and "Idle", $T_2$=2 ns for the command "Write" and $T_3$=4 ns for the execution of the commands "Pre-charge" and "Idle".

DC-specifications are focused on power supply level and on input signal level. A typical DC-specification has a permissible interval for the power supply level, such as an Input Voltage Low VIL=0.4V and an Input Voltage High VIH=3.3V. A further typical DC-specification has default values for a power supply ramp up sequence, especially a temporal course for the power supply level beginning with $V_0$=0V and ending with $V_1$=3.3V.

In order to understand weaknesses of electronic components, designers and manufacturers must always characterize their construction based on their various AC- and DC-specification range.

In the embodiment, the logical test structure 20 of the test program includes an AC-specification with a AC-waveform generator, a DC-specification with a DC-level controller, a test pattern with a vector memory, and a pattern generator.

The AC-specifications and the DC-specifications are to be entered into the computer system 1 by a user via a keyboard or via a mouse. According to the invention, the AC-specifications and/or the DC-specifications can be generated automatically by a separate computer program and can be imported into the test program.

Based on the DC-specifications, the DC-level controller generates the power supply voltage level for the test chip 2. Based on the AC-specifications, the AC-waveform generator generates programmed waveforms for the power supply voltage level of the test chip 2.

The vector memory of the logical test structure 20 generates the test patterns for the test chip 2. These test patterns can either be manually entered into the computer system 1 by a user via a keyboard or via a mouse or can be generated automatically by the test program. It is also conceivable, that these test patterns can be generated automatically by a separate computer program and can be imported into the test program.

The pattern generator integrates the power supply voltage level generated from the DC-level controller, the programmed waveforms for the power supply voltage from the AC-waveform generator and the test patterns from the vector memory. Finally, the pattern generator transmits the power supply voltage with its defined level and waveform to the test chip 2 via the power supply line 19. The pattern generator also transmits the test patterns to the test chip 2 via the clock line 13, via the command line 14, via the address line 15 and via the data-in line 16.

Figure 3:
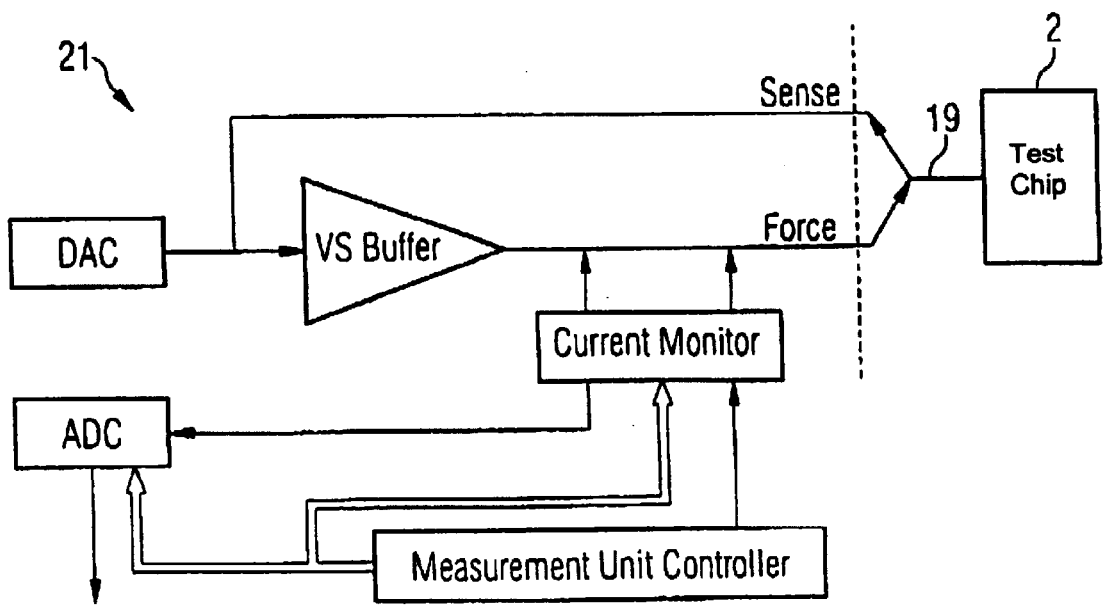
FIG. 3 is a schematic representation showing the measurement configuration on the computer system according to FIG. 1 and the test chip according to FIG. 1 connected to that measurement configuration.

FIG. 3 shows a schematic representation of the measurement configuration 21 on the computer system 1 and the test chip 2 connected to that measurement configuration 21.

The measurement configuration 21 includes a measurement unit controller, a current monitor, a digital-analogue-converter "DAC", an analogue-digital-converter "ADC", and a voltage supply buffer.

The digital-analogue-converter is connected to the voltage supply buffer, which itself is connected to the test chip 2 via a force line. In the measurement configuration 21 there is both a sense line and a force line, both being connected to the power supply line 19. The force line comes from the output side of the voltage supply buffer and the sense line comes from the input side of the voltage supply buffer.

The digital-analogue-converter receives digital values from the pattern generator and transforms the digital values into actual analogue voltage values for transmitting to the test chip 2 via the force line and via the power supply line 19.

The current monitor for the specified voltage supply is connected to the force line. It measures the current through the force line resistance on the output side of the voltage supply buffer. The analogue-digital-converter reads the analogue measured current values and generates a digital equivalent.

The current monitor is controlled by the measurement unit controller, which also triggers the test start. The measurement unit controller itself is controlled by the test program according to the invention.

The function of the measurement configuration 21 is known to a man skilled in the art and needs no further explanation.

FIG. 4 shows a pseudo-code-listing 22 of the test program for the test chip 2 executable on the computer system 1.

In the embodiment, the pseudo-code-listing 22 includes twenty-three (23) numbered lines. The pseudo-code-listing 22 describes the working procedure of the test program for the test chip 2 according to the invention.

Before starting the test program, the test chip 2 is connected to the computer system 1 with its lines 13 to 19.

In the first line a default specification is saved to a memory area of the computer system 1, including a test pattern and reference specifications. This default specification is dependent both on the test chip 2, which is connected to the computer system 1 and on the computer system 1 itself. The computer system 1 automatically identifies the type of the test chip 2 and automatically sets the appropriate default specifications.

In the second line, the test pattern P, the AC-specifications $RS_{AC}(RV,ARS)$ and/or the DC-specifications $RS_{DC}(RV, ARS)$ are entered into the computer system 1 by a user. The AC-specifications $RS_{AC}(RV,ARS)$ and/or the DC-specifications $RS_{DC}(RV,ARS)$ can include input reference values RV, e.g. 5 ns, 6 ns, 7 ns, ..., 20 ns and analysis resolution steps ARS. For example, if the reference values increase by t=1 ns with each step and fifteen (15) steps will be carried out, then ARS equals fifteen (15). m is the total number of reference values RV.

The input test patterns, the AC-specifications and/or the DC-specifications can also be imported into the test program from other programs running on the computer system 1.

In line 3, there is a For loop triggering the repeating of the commands in the lines 4 to 16. This repeat takes place m times, as there are altogether m reference values RV. There is a control variable i starting with the value i=0 and incremented by the value "1" with every repeat of the For loop.

In line 4 and 5, a check is carried out, if the combination of the AC-specifications $RS_{AC}(RV,i)$ and of the DC-specifications $RS_{DC}(RV,i)$ is valid. This can happen, if the AC-specifications $RS_{AC}(RV,i)$ and/or the DC-specifications $RS_{DC}(RV,i)$ are not permissible for the test chip 2 or are not within the range of the default specifications. In case, that the combination turns out to be invalid, the test program terminates giving an error message as a result.

In line 6, there is a If-Then-Statement checking, if the AC-specifications $RS_{AC}(RV,i)$ and the DC-specifications $RS_{DC}(RV,i)$ are valid. If so, the commands in the lines 8 to 15 get carried out.

In line 8, a hardware DC/AC-driver is set to the AC-specifications $RS_{AC}(RV,i)$ and/or to the DC-specifications $RS_{DC}(RV,i)$. In line 9, a check takes place, if the pattern $P_i$ includes static patterns as well as dynamic patterns.

In line 10, the pattern generator described in FIG. 2 is started. Then the current measurement and the current calculation are started.

$$I_{Measurement}(T(P_i,RS(RV,i)))=I_{R_{eff}}(T(P_i,RS(RV,i)))+\Delta I_{CMOS}(T(P_i,RS(RV,i))) \quad (9)$$

The actual current values $I_{R_{eff}}(T(P_i,RS(RV,i)))$, $I_{L_{eff}}(T(P_i,RS(RV,i)))$ and $\Delta I_{CMOS}(T(P_i,RS(RV,i)))$ are measured by the current monitor described in FIG. 3. The total current value $I_{Measurement}(T(P_i,RS(RV,i)))$ is calculated using the equation (9).

In line 15, the pattern generator described in FIG. 2 stops.

In the lines 17 to 22, the total current values $I_{Measurement}(T(P_i,RS(RV,i)))$ or all the treated values of the control variable i are put out.

Finally, in line 23, the default specification $T_{default}=T(P_{default}, RS_{default})$ is restored, to avoid a change of the test conditions for the next test.

In the embodiment, it is assumed that this algorithm is programmed as a customs test template for design analysis and for characterization purposes.

FIG. 5 shows a pattern table 23 including a test pattern for the test chip 2. In the embodiment, this pattern table 23 has been generated manually by a user.

The pattern table 23 is a static pattern table, as it will not be changed during the performed tests. The pattern table 23 has six columns, the columns 2 to 6 particularly corresponding to lines 13 to 17 of the test chip 2. The first column showing the line numbers only serves to clarify the embodiment. However, this column is not included in the original pattern table 23.

In particular, the column "Clock" shows the actual clock signal transmitted via the clock line 13, the column "Command" includes the commands transmitted via the command line 14. The commands are coded in the computer system 1 by concrete values, e.g. the command "Activate" has the value "0", "Read" has the value "1", "Write" has the value "2", "Idle" has the value "f" and "Pre-charge" has the value "3". The column "Address" involves the particular address of the test chip 2, as transmitted in the address line 15 and the column "Data Input" includes the input data for the test chip 2, transmitted to the test chip 2 via the data-in line 16. The column "Data Output" shows the output data transmitted to the computer system 1 by the test chip 2 via the data-out line 17.

It is also conceivable to provide a column "Failbit" indicating the particular failbits sent to the computer system 1 by the test chip 2 via the failbit line 18. However, as there is no self-test 5 activated in the current embodiment and thus there is no data transmitted via the failbit line 18, no column "Failbit" is shown in FIG. 5.

The test pattern shown in FIG. 5 is a typical test pattern generated by the test program of the computer system 1. The test pattern performs a simple write and read operation.

In the first line, the command "Activate" is provided together with the address "Row 5". That means, that the fifth row of the test chip 2 is opened.

From the second to the fifth line, data is written into the test chip 2. In detail, the character "a" is written into the first and into the third column and the character "5" is written into the second and into the fourth column of the test chip 2.

From the sixth to the ninth line, data is read out of the test chip 2. In particular, the character "a" is read out of the columns 1 to 4 of the test chip 2. This data is intended to be compared with the data written into the test chip 2 in the lines 2 to 5.

In line 9, a data output string "R00" is additionally provided indicating no error.

In line 10 the command "Idle" is provided for the test chip 2, forcing it to stay in idle motion. Moreover, the line 10 has a data output string "RFF" indicating an error occurred in that particular line.

Line 11 also shows the command "Idle", but has the data output string "R00" indicating no error occurred.

Finally, line 12 provides the command "Pre-charge", forcing the test chip to close the line 5 as well as the data output string "RFF" indicating an error occurred in line 12.

FIG. 6 shows a voltage-current diagram 24 of a first run of the test program according to a first embodiment.

The voltage-current diagram 24 visualizes the value course of the output current of the test chip 2 measured by the current monitor explained in FIG. 3 dependent on different input voltage values.

The DC-parameter supply voltage for the test chip 2 is defined as 2.5V. As shown in FIG. 6, thirty (30) different values for the supply voltage are applied to the test chip 2, starting with $V_1=1.0V$ and ending with $V_{30}=3.9V$, the resolution step ARS being 0.1V.

For each of the thirty (30) different voltage values, the test pattern shown in FIG. 5 and a frequency of 100 MHz are applied to the test chip 2. The pattern generator shown in FIG. 3 transmits the test pattern, the particular voltage values and the frequency to the test chip 2.

The value course of the output current of the test chip 2 shows a discontinuity between $V_{12}=2.1V$ and $V_{13}=2.2V$, where the current jumps from $I_{12}=0.000152$ A to $I_{12}=0.0145175$ A.

FIG. 7 shows a period-current diagram 25 of a second run of the test program according to a second embodiment.

The period-current diagram 25 visualizes the value course of the output current of the test chip 2 measured by the current monitor explained in FIG. 3 dependent on different operating frequencies.

The typical operating frequency range of the test chip 2 is defined as FR=[50 MHz; 200 MHz]. In the current embodiment, thirty (30) different values for the frequency and for the period respectively are applied to the test chip 2, starting with $f_1=28.4$ MHz ($T_1=34$ ns) and ending with $f_{30}=300$ MHz ($T_{30}=5$ ns), the resolution step ARS being 1 ns.

For each of the 30 different frequency values, the test pattern shown in FIG. 5 and a supply voltage of 2.5 V are applied to the test chip 2. The pattern generator shown in FIG. 3 transmits the test pattern, the supply voltage and the particular frequencies to the test chip 2.

In the viewed interval between $f_1=28.4$ MHz ($T_1=34$ ns) and $f_{30}=300$ MHz ($T_{30}=5$ ns) the output current of the test chip 2 increases with increasing frequency and with decreasing period respectively. The value course of the output current of the test chip 2 shows a discontinuity between $T_{26}=9$ ns and $T_{28}=7$ ns, where the current jumps from $I_{26}=0.0390$ A to $I_{27}=0.06075$ A and drops to $I_{28}=0.0475$ A. Based on this discovery further analysis can be performed.

The data output of the test chip 2, which is not shown here, gives an error message for the second ($2^{nd}$) and for the fourth ($4^{th}$) column of the considered row of the test chip 2, in particular for each of the applied frequencies.

In the following passage, the function of the test program according to the invention is discussed with respect to both the first and the second embodiment.

First of all the user connects the test chip 2 to the computer system 1 as shown in FIG. 1. Then the user loads the test program, whose logical test structure 20 is sketched in FIG. 2, into the computer system 1 and starts the test program. Thereafter, the user sets up a current analysis template, which is part of the test program, via text format off line or via a graphical user interface on-line. The current analysis template includes the AC-specifications and/or the DC-specifications as well as the test patterns to be entered by the user. The AC-specifications and/or the DC-specifications can especially be entered into the current analysis template by entering a start value, a stop value and a measurement resolution step.

In the first embodiment, the user would like to study the dynamic current behavior dependent on the input voltage measured on the power supply line 19 and therefore chooses the DC-parameter: "input voltage". He enters the interval by typing in a start value $V_{start}=1.0V$ and a stop value $V_{stop}=$ 3.9V and he enters the resolution step ARS=0.1V. The characteristic AC-parameter is f=100 MHz and can be selected by the user. Thereafter the user enters the test pattern described in FIG. 5 into the computer system 1. It is also conceivable to import this test pattern from a separate file or from a separate program. Entering all these values in the computer system only takes about a minute for an experienced user.

Then the test program checks if the entered DC-specifications are valid and available. If they are not, the test program will return an error message and stop immediately. If the DC-specifications are valid, the test program will select the first DC-specification, which is $V_{start}$=1.0V and process this DC-specification via its DC-level controller, which is explained in FIG. 2. In parallel the AC-waveform generator, which is also shown in FIG. 2, operates at a single frequency of f=100 MHz. The test program continues to check, if the input pattern is valid and available and will return an error message, if the pattern is not valid.

Subsequently, the test pattern generator generates the final pattern input signal and transmits both the power supply voltage and the test patterns to the test chip 2 as explained in FIG. 2. Different patterns and different specifications create different conditions for the internal signal activity in the test chip 2. The current profile will be different due to this fact. Therefore, the static and/or the dynamic current measurement and calculation take place as shown in FIG. 3, the pattern generator having generated its patterns based on the first DC-specification $V_{start}$=1.0V, based on the fixed AC-specification f=100 MHz and based on the test pattern described in FIG. 5.

Subsequently, the operation of the pattern generator and the current measurement and calculation will be executed for each DC-specification $V_2$=1.1V, $V_3$=1.2V, . . . , $V_{30}$= 3.9V.

Once the test pattern P, the input reference values RV, and the analysis resolution step ARS are applied to the computer system 1, the current monitor of the computer system 1 will take the measurement of $I_{R_{eff}}$(T(P,RS(RV,ARS))), $I_{L_{eff}}$(T(P,RS(RV,ARS))) and $\Delta I_{CMOS}$(T(P,RS(RV,ARS))) according to the measurement time constant T.

Finally, the complete current $I_{Measurement}$(T(P,RS(RV,ARS))) can be computed by using equation (9):

$$I_{Measurement}(T(P,RS(RV,ARS)))=I_{R_{eff}}(T(P,RS(RV,ARS)))+I_{L_{eff}}(T(P,RS(RV,ARS)))+\Delta I_{CMOS}(T(P,RS(RV,ARS))), \forall T \geq 0 \quad (9)$$

The final results will be generated when all DC-specifications have been executed using the pattern generator. The test results for this first embodiment are visualized in FIG. 6. Based on the discoveries derived from these test results further analysis, corrections or reconfiguration of the test chip 2 can be performed.

The data output of the test chip 2, which is not shown here, gives no error message "R00" for the $1^{st}$ and for the $3^{rd}$ column and an error message "RFF" for the $2^{nd}$ and for the $4^{th}$ column of the considered row of the test chip 2, in particular for each of the applied voltage values.

In particular, the first "Read"-Command in line 6 reads the data, which is in the column "1" of the row "5". This is the character "a", which was written into the column 1 of the row "5" of the test chip in line 2 of the pattern table 23. This character is now compared to the character "a", which is expected according to the value in column "Data Input" in line 6. This comparison does not result in an error, so the data output in line 9 is "R00".

In the embodiment, each read instruction is delayed by 2 cycles by the delay pipeline 9 for data reading by sensing circuitry and by the compare logic 10. This feature is normally called latency. In the embodiment, we have a latency 2. That means, the read commands are executed by the computer system 1 after having waited two (2) cycles. So, the data output of the Read commands of the lines 6 to 9 are provided in the lines 9 to 12.

Due to different requirements, other latencies, such as latency 1 or latency 3 can be provided. Latency 1 is used to wait one (1) cycle before executing a Read command, Latency 3 is used to wait three (3) cycles before executing a Read command.

The second "Read"-Command in line 7 reads the character "5" in the column "2" of the row "5" and compares it to the character "a". This comparison results in an error, so the data output in line 10 is "RFF". The third "Read"-Command in line 8 reads the character "a" in the column "3" of the row "5" and compares it to the character "a". This comparison gives no error, so the data output in line 11 is "R00". The fourth "Read"-Command in line 9 reads the character "5" in the column "4" of the row "5" and compares it to the character "a". This comparison gives an error, so the data output in line 12 is "RFF".

Finally the previous AC-specifications and DC-specifications are stored to avoid the test conditions change for the next test.

In the second embodiment the user likes to study the speed-related dynamic current behavior dependent on the operating frequency measured on the power supply line 19 and therefore chooses the AC-parameter: "frequency" and "period" respectively. He enters the interval by typing in a start value $T_{start}$=34 ns and a stop value $T_{stop}$=5 ns and he enters the resolution step ARS=1 ns. The characteristic DC-parameter is V=2.5V and can be selected by the user. After that, the user enters the test pattern described in FIG. 5 into the computer system 1. It is also conceivable to import this test pattern from a separate file or from a separate program. Entering all these values in the computer system only takes about a minute for an experienced user.

Then the test program checks, if the entered AC-specifications are valid and available. If they are not, the test program will return an error message and will stop immediately. If the AC-specifications are valid, the test program selects the first AC-specification, which is $T_{start}$=34 ns and processes this AC-specification via its AC-waveform generator, which is explained in FIG. 2. In parallel the DC-level controller, which is also shown in FIG. 2, is operating at a fixed level of V=2.5V. The test program continues checking, if the input pattern is valid and available and returns an error message, if the pattern is not valid and available.

Subsequently, the test pattern generator generates the final pattern input signal and transmits both the power supply voltage with the particular frequency and the test patterns to the test chip 2 as explained in FIG. 2. Then the static and/or the dynamic current measurement and calculation take place as shown in FIG. 3, the pattern generator having generated its patterns based on the first AC-specification $T_{start}$=34 ns, based on the fixed DC-level of V=2.5V and based on the test pattern described in FIG. 5.

Subsequently, the operation of the pattern generator and the current measurement and calculation will be executed for each AC-specification $T_2$=33 ns, $T_2$=32 ns, . . . , $T_{30}$=5 ns. The final results will be generated when all AC-specifications have been executed using the pattern generator. The test results for this second embodiment are visualized in FIG. 7. Based on the discoveries derived from these test results further analysis, corrections or reconfiguration of the test chip 2 can be performed.

The data output of the test chip 2, which is not shown here, puts out an error message for the 2$^{nd}$ and for the 4$^{th}$ column of the considered row of the test chip 2, in particular for each of the applied voltage values.

Finally, the previous AC-specifications and DC-specifications are stored to avoid the test conditions change for the next test.

I claim:

1. A method for testing an electronic component connected to a computer system, the method which comprises the following steps:
   a) reading into the computer system a test pattern for testing a logical functionality of the electronic component;
   b) reading into the computer system a number of parameters;
   c) checking with the computer system if the parameters read in step b) are valid and available;
   d) selecting a first of the parameters;
   e) generating with the computer system an input test pattern for the electronic component, the input test pattern including the test pattern read in step a) and a power supply voltage with a DC-level according to a DC-parameter and with a frequency according to an AC-parameter;
   f) checking with the computer system if the input test pattern generated in step e) is valid and available;
   g) applying the input test pattern generated in step e) to the electronic component in a simulation process by using the computer system;
   h) performing the simulation process processing the input test pattern with the electronic component, measuring a current flowing in the electronic component, and recording output data from the electronic component with the computer system;
   i) calculating with the computer system an expected value of the current flowing in the electronic component and expected output data of the electronic component;
   j) storing, in the computer system, data including the input test pattern, the recorded and the expected output data of the electronic component, and the measured and the expected values of the current;
   k) selecting a next one of the parameters;
   l) repeating the steps e) to k) until all of the parameters have been processed; and
   m) analyzing the data stored in step j) and making a statement concerning a functionality of the tested electronic component by considering a deviation between the measured and the expected values of the current and by considering a deviation between the recorded and the expected output data of the electronic component.

2. The method according to claim 1, wherein the electronic component is a memory chip.

3. The method according to claim 1, wherein the test patterns are selected from the group consisting of static test patterns and dynamic test patterns.

4. The method according to claim 1, wherein the parameters are selected from the group consisting of AC-parameters and DC-parameters.

5. The method according to claim 1, which further comprises fabricating the electronic component with an input line for transmitting input data from the computer system to the electronic component, an output line for transmitting output data from the electronic component to the computer system, and a power supply line.

6. The method according to claim 5, wherein the input line is a clock line.

7. The method according to claim 5, wherein the input line is a command line.

8. The method according to claim 5, wherein the input line is an address line.

9. The method according to claim 5, wherein the input line is a data input line.

10. The method according to claim 5, which further comprises, in step h), measuring the current flowing in the electronic component using a resistance of the power supply line of the electronic component.

11. The method according to claim 5, which further comprises fabricating the computer system with a pattern generator generating input test patterns applicable to the electronic component via the data input line, via the data output line, and the power supply line, the pattern generator including a DC-level controller, an AC-waveform generator, and a vector memory.

12. A computer program, comprising program instructions for causing a computer system to perform the method for testing an electronic component according to claim 1.

13. A computer system, comprising a computer program according to claim 12.

14. A method, which comprises downloading a computer program according to claim 12 from an electronic data network to a computer system connected to the electronic data network.

15. The method according to claim 14, wherein the data network is the Internet.

16. A computer readable medium, comprising computer-executable instructions for performing the method according to claim 1.

17. A computer memory, comprising computer-executable instructions for performing the method according to claim 1.

18. A read-only memory, comprising computer-executable instructions for performing the method according to claim 1.

19. An electrical carrier signal, comprising computer-executable instructions for performing the method according to claim 1.

20. A carrier, comprising computer-executable instructions for performing the method according to claim 1.

21. A data carrier, comprising computer-executable instructions for performing the method according to claim 1.

22. A method for testing an electronic component connected to a computer system, the method which comprises the following steps:
   a) reading into the computer system a test pattern for testing a logical functionality of the electronic component;
   b') reading into the computer system a number of DC-parameters and a fixed frequency;
   c) checking with the computer system if the parameters read in step b) are valid and available;
   d') selecting a first DC-parameter from the number of DC-parameters;
   e') generating with the computer system an input test pattern for the electronic component, the input test pattern including the test pattern read in step and a power supply voltage with a DC-level according to the DC-parameter selected in at least one of step d') and a next DC-parameter to be selected in step k') and with the frequency read in step b');
   f) checking with the computer system if the input test pattern generated in step e) is valid and available;

g) applying the input test pattern generated in step e) to the electronic component in a simulation process by using the computer system;

h) performing the simulation process processing the input test pattern with the electronic component, measuring a current flowing in the electronic component, and recording output data from the electronic component with the computer system;

i) calculating with the computer system an expected value of the current flowing in the electronic component and expected output data of the electronic component;

j) storing, in the computer system, data including the input test pattern, the recorded and the expected output data of the electronic component, and the measured and the expected values of the current;

k') selecting the next DC-parameter from the number of DC-parameters; and l') repeating steps e'), f), g), h), i), j), and k') until all of the number of DC-parameters are processed.

23. The method according to claim 22, wherein, step b') includes reading into the computer system a fixed period.

24. The method according to claim 23, which further comprises performing step b') by reading with the computer system reads the first DC-parameter, a last of the DC-parameters, a resolution step for the DC-parameters, the fixed frequency, and the fixed period.

25. The method according to claim 22, which further comprises performing step b') by reading with the computer system the first DC-parameter, a last of the DC-parameters, a resolution step for the DC-parameters, and the fixed frequency.

26. The method according to claim 22, which further comprises calculating the expected value of the current flowing in the electronic component with the computer system in step i) by using a formula:

$$I_{Measurement}(T(P,RS(RV,ARS)))=I_{R_{eff}}(T(P,RS(RV,ARS)))+I_{L_{eff}}(T(P,RS(RV,ARS)))+\Delta I_{CMOS}(T(P,RS(RV,ARS))), \forall T \geq 0$$

with T being a time constant, P being a set of current test patterns, RS being a reference specification of the electronic component, RV being the DC-parameters, ARS being an analysis resolution step, $R_{eff}$ being a lumped effective resistance on a power supply line of the electronic component, $L_{eff}$ being a lumped effective inductance on the power supply line of the electronic component and $\Delta I_{CMOS}(T)$ being a current calculated by using a Complementary Metal Oxide Semiconductor current estimation model.

27. The method according to claim 22, which further comprises fabricating the electronic component with an input line for transmitting input data from the computer system to the electronic component, an output line for transmitting output data from the electronic component to the computer system, and a power supply line.

28. The method according to claim 27, wherein the input line is a clock line.

29. The method according to claim 27, wherein the input line is a command line.

30. The method according to claim 27, wherein the input line is an address line.

31. The method according to claim 27, wherein the input line is a data input line.

32. The method according to claim 27, which further comprises, in step h), measuring the current flowing in the electronic component using a resistance of the power supply line of the electronic component.

33. The method according to claim 27, which further comprises fabricating the computer system with a pattern generator generating input test patterns applicable to the electronic component via the data input line, via the data output line, and the power supply line, the pattern generator including a DC-level controller, an AC-waveform generator, and a vector memory.

34. A computer program, comprising program instructions for causing a computer system to perform the method for testing an electronic component according to claim 22.

35. A computer system, comprising a computer program according to claim 34.

36. A method, which comprises downloading a computer program according to claim 34 from an electronic data network to a computer system connected to the electronic data network.

37. The method according to claim 36, wherein the data network is the Internet.

38. A computer readable medium, comprising computer-executable instructions for performing the method according to claim 22.

39. A computer memory, comprising computer-executable instructions for performing the method according to claim 22.

40. A read-only memory, comprising computer-executable instructions for performing the method according to claim 22.

41. An electrical carrier signal, comprising computer-executable instructions for performing the method according to claim 22.

42. A carrier, comprising computer-executable instructions for performing the method according to claim 22.

43. A data carrier, comprising computer-executable instructions for performing the method according to claim 22.

44. A method for testing an electronic component connected to a computer system, the method which comprises the following steps:

a) reading into the computer system a test pattern for testing a logical functionality of the electronic component;

b*) reading into the computer system a number of AC-parameters and a fixed DC-level;

c) checking with the computer system if the parameters read in step b) are valid and available;

d*) selecting a first of the number of AC-parameters;

e*) generating an input test pattern for the electronic component with the computer system, the input test pattern including the test pattern read in step a) and a power supply voltage with the frequency according to at least one of the AC-parameter selected in step d*) and a next of the AC-parameters to be selected in step k*) and with the fixed DC-level read in step b*);

k*) selecting the next of the number of AC-parameters; and l*) repeating the steps e*), f), g), h), i), j), and k*), until all of the number of AC-parameters are processed.

45. The method according to claim 44, which further comprises performing step b*) by reading with the computer system the first of the number of AC-parameters, a last of the number of AC-parameters, a resolution step for the number of AC-parameters, and the fixed DC-level.

46. The method according to claim 44, which further comprises calculating the expected value of the current flowing in the electronic component with the computer system in step i) by using a formula:

$$I_{Measurement}(T(P,RS(RV,ARS)))=I_{R_{eff}}(T(P,RS(RV,ARS)))+I_{L_{eff}}(T(P,RS(RV,ARS)))+\Delta I_{CMOS}(T(P,RS(RV,ARS))), \forall T \geq 0$$

with T being a time constant, P being a set of current test patterns, RS being a reference specification of the electronic component, RV being the AC-parameters, ARS being an analysis resolution step, $R_{eff}$ being a lumped effective resistance on a power supply line of the electronic component, $L_{eff}$ being a lumped effective inductance on the power supply line of the electronic component and $\Delta I_{CMOS}(T)$ being a current calculated by using a Complementary Metal Oxide Semiconductor current estimation model.

47. The method according to claim 44, which further comprises fabricating the electronic component with an input line for transmitting input data from the computer system to the electronic component, an output line for transmitting output data from the electronic component to the computer system, and a power supply line.

48. The method according to claim 47, wherein the input line is a clock line.

49. The method according to claim 47, wherein the input line is a command line.

50. The method according to claim 47, wherein the input line is an address line.

51. The method according to claim 47, wherein the input line is a data input line.

52. The method according to claim 47, which further comprises, in step h), measuring the current flowing in the electronic component using a resistance of the power supply line of the electronic component.

53. The method according to claim 47, which further comprises fabricating the computer system with a pattern generator generating input test patterns applicable to the electronic component via the data input line, via the data output line, and the power supply line, the pattern generator including a DC-level controller, an AC-waveform generator, and a vector memory.

54. A computer program, comprising program instructions for causing a computer system to perform the method for testing an electronic component according to claim 44.

55. A computer system, comprising a computer program according to claim 54.

56. A method, which comprises downloading a computer program according to claim 54 from an electronic data network to a computer system connected to the electronic data network.

57. The method according to claim 56, wherein the data network is the Internet.

58. A computer readable medium, comprising computer-executable instructions for performing the method according to claim 44.

59. A computer memory, comprising computer-executable instructions for performing the method according to claim 44.

60. A read-only memory, comprising computer-executable instructions for performing the method according to claim 44.

61. An electrical carrier signal, comprising computer-executable instructions for performing the method according to claim 44.

62. A carrier, comprising computer-executable instructions for performing the method according to claim 44.

63. A data carrier, comprising computer-executable instructions for performing the method according to claim 44.

* * * * *

UNITED STATES PATENT AND TRADEMARK OFFICE
CERTIFICATE OF CORRECTION

PATENT NO. : 6,842,712 B2
DATED : January 11, 2005
INVENTOR(S) : Chee Hong Eric Liau It is certified that error appears in the above-identified patent and that said Letters Patent is hereby corrected as shown below:

Column 5,
Lines 13 and 14, should read as follows:

$$I_{Measurement}(T(P,RS(RV,ARS))) = I_{R_{ef}}(T(P,RS(RV,ARS))) + I_{L_{ef}}(T(P,RS(RV,ARS)))$$

$$+ \Delta I_{CMOS}(T(P,RS(RV,ARS))), \forall T \geq 0$$

Signed and Sealed this

Twenty-sixth Day of April, 2005

JON W. DUDAS
*Director of the United States Patent and Trademark Office*

UNITED STATES PATENT AND TRADEMARK OFFICE
CERTIFICATE OF CORRECTION

PATENT NO. : 6,842,712 B2
APPLICATION NO. : 10/431900
DATED : January 11, 2005
INVENTOR(S) : Chee Hong Eric Liau It is certified that error appears in the above-identified patent and that said Letters Patent is hereby corrected as shown below:

Column 7, lines 1 & 2 should read as follows:

$I_{Measurement}(T(P,RS(RV,ARS))) = I_{Reff}(T,(P.RS(RV,ARS))) + I_{Leff}(T(P,RS(RV,ARS))) + \Delta I_{CMOS}(T(P,RS(RV,ARS))), \forall T \geq 0$ Signed and Sealed this Fourth Day of July, 2006

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 6,842,712 B2 |
| APPLICATION NO. | : 10/431900 |
| DATED | : January 11, 2005 |
| INVENTOR(S) | : Chee Hong Eric Liau |

It is certified that error appears in the above-identified patent and that said Letters Patent is hereby corrected as shown below:

Column 12, line 57 to 58 should read as follows:

$$I_{Measurement}(T(P,RS(RV,ARS))) = I_{R_{ef}}(T(P,RS(RV,ARS))) + I_{L_{ef}}(T(P,RS(RV,ARS)))$$
$$+ \Delta I_{CMOS}(T(P,RS(RV,ARS)))$$

Signed and Sealed this

Twenty-third Day of January, 2007

JON W. DUDAS
*Director of the United States Patent and Trademark Office*